United States Patent
Yu et al.

(10) Patent No.: US 7,705,678 B2
(45) Date of Patent: Apr. 27, 2010

(54) AMPLIFIER USING IMPEDANCE CIRCUIT FOR CANCELING CUTOFF

(75) Inventors: Liu Yu, Kawasaki (JP); Masato Yoshioka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/362,113

(22) Filed: Jan. 29, 2009

(65) Prior Publication Data

US 2009/0295478 A1    Dec. 3, 2009

(30) Foreign Application Priority Data

May 30, 2008  (JP)  ............... 2008-142617

(51) Int. Cl.
*H03F 3/45* (2006.01)
(52) U.S. Cl. ...................... 330/253; 330/302
(58) Field of Classification Search ............... 330/253, 330/302
See application file for complete search history.

(56) References Cited

U.S. PATENT DOCUMENTS

| | | | | |
|---|---|---|---|---|
| 5,384,501 A | * | 1/1995 | Koyama et al. | ............ 327/336 |
| 5,610,547 A | * | 3/1997 | Koyama et al. | ............ 327/350 |
| 5,852,521 A | * | 12/1998 | Umeyama et al. | ............ 360/46 |
| 6,346,856 B1 | * | 2/2002 | Myers et al. | ............ 330/252 |
| 7,071,780 B2 | * | 7/2006 | Van Zanten | ............ 330/258 |
| 7,170,349 B2 | * | 1/2007 | Bhattacharjee et al. | ...... 330/254 |
| 2007/0018725 A1 | | 1/2007 | Morikawa et al. | |

FOREIGN PATENT DOCUMENTS

JP    A 2007-43654    2/2007

* cited by examiner

*Primary Examiner*—Patricia Nguyen
(74) *Attorney, Agent, or Firm*—Greer, Burns & Crain, Ltd.

(57) ABSTRACT

An amplifier circuit includes a pair of transistors amplifying differential signals of input signals to respective input terminals and outputting differential output signals to respective output terminals, and an impedance circuit provided in between sources of the pair of transistors, canceling a first cutoff characteristic on a high frequency side in frequency characteristics of the amplifier circuit constructed of the pair of transistors, and forming a second cutoff characteristic on a higher frequency side than the first cutoff characteristic.

4 Claims, 10 Drawing Sheets

AMPLIFIER USING IMPEDANCE CIRCUIT FOR CANCELING CUTOFF

CROSS-REFERENCE TO RELATED APPLICATIONS

This application is based upon and claims the benefit of priority of the prior Japanese Patent Application No. JP2008-142617, filed on May 30, 2008, the entire contents of which are incorporated herein by reference.

FIELD

The embodiment(s) discussed herein is (are) related to an amplifier circuit.

BACKGROUND

An analog buffer circuit is given as one of applications of an amplifier circuit. One of characteristics of the analog buffer circuit can be exemplified by having a linear relation between amplitude of an input signal and amplitude of an output signal. Some analog buffer circuits, in which the amplitude of the output signal has a relation of an amplification degree "1" with respect to the amplitude of the input signal, are also utilized. In this case, the output signal becomes a signal into which the input signal is reproduced as it is. This type of amplifier circuit is used for the purpose of isolating the input side and the output side so that the input side and the output side do not affect each other. In this case, the amplifier circuit drives a heavy load and forms a high input impedance on the input side.

Circuits in, e.g., FIGS. 1 through 3 are known as amplifier circuits that provide this type of function. FIG. 1 illustrates an example of a voltage follower using an operational amplifier. In the circuit in FIG. 1, in an idealistic state where a degree-of-amplification K is infinity and an input impedance is infinity, an output-to-input relation becomes Vout=Vin, and the output signal becomes a signal in which the input signal is reproduced with fidelity.

FIG. 2 illustrates an example of a source follower. The source follower is a circuit in which a drain is earthed, and a load is provided on the source side. In the circuit in FIG. 2, let Vgs be a voltage between the gate and the source, Vth be a threshold voltage of a transistor M1, $\beta$ be an amplification factor of an electric current, ids be the current flowing to the drain from the source, Vi be an input voltage inputted to the gate, Vo be an output voltage output from a terminal on the source side and Iout be an output current, and there are relations given in the following mathematical expressions 1-3.

$$ids = \beta(Vgs - Vth)^2 \quad \text{(Mathematical Expression 1)}$$

$$Vo = Vi - Vgs = Vi - Vth - (ids/\beta)^{1/2} \quad \text{(Mathematical Expression 2)}$$

$$ids = Ib - Iout \quad \text{(Mathematical Expression 3)}$$

FIG. 3 illustrates an example of a linear amplifier buffer. The linear amplifier buffer converts input voltages Vin+ and Vin− into the currents by use of a voltage/current converter. Then, the linear amplifier buffer linearly converts the thus-converted currents into the voltages by use of a resistance. In this case, a relation (which is termed a transfer function) between the input voltage Vin(=Vin+−Vin−) and the output voltage Vo(=Vout+−Vout−) can be expressed in the following mathematical expression 4. Herein, gm is a transconductance (mutual conductance) of the transistor. Further, if the transconductance gm is sufficiently large, an item of gm can be ignored with the denominator in the mathematical expression 4. As a result, it follows that the relation between the input voltage Vin and the output voltage Vo is determined by a resistance ratio Rload/Rd as in the mathematical expression 5.

$$Vo = Vin \times Rload/(Rd + 2/gm) \quad \text{(Mathematical Expression 4)}$$

$$Vo = Vin \times Rload/Rd \quad \text{(Mathematical Expression 5)}$$

Note that a load capacity inserted in parallel with the resistance Rload and a parasitic capacitance parasitic to the output side are combined into Cload, at which time the relation between the input voltage Vin and the output voltage Vo can be expressed in the following mathematical expression 6. Herein, s is a complex variable.

$$Vo = Vin \times (Rload/Rd)/(1 + s \times Rload \times Cload) \quad \text{(Mathematical Expression 6)}$$

[Patent document 1] Japanese Patent Laid-Open Publication No. 2007-43654

SUMMARY

Take the circuit in FIG. 1 for example, however, it is difficult to obtain the operational amplifier which operates with a high degree of amplification in a broadband. As a result, linearity is hard to be acquired in the broadband.

Further, in the source follower, according to the mathematical expression 2, a DC (direct current) shift occurs due to a variation of Vth or a variation of the output current Iout (i.e., a variation of the current ids between the source and the drain). Still further, even when the load is fixed, a degree of linearity varies due to a signal amplitude. Accordingly, if the amplitude of the input signal increases, the degree of linearity decreases.

Moreover, in the case of the linear amplifier buffer, the total sum Cload of the load capacity and the parasitic capacity affects the operation band. Namely, the transfer function in the mathematical expression 6 has a pole when s=−1/(Rload× Cload). Accordingly, the amplification degree in the high frequency is cut off by a treble cutoff frequency (a cutoff frequency on a high frequency side on a frequency axis of frequency characteristics) shown by wp=1/(Rload×Cload).

A technology to be disclosed is provided for solving the problems of the conventional amplifiers described above. Namely, it is an object of the technology to be disclosed to provide an amplifier circuit capable of ensuring the linearity in a broader band than by the prior arts.

One mode to be disclosed can be exemplified as an amplifier including: a pair of transistors amplifying differential signals of input signals to respective input terminals and outputting differential output signals to respective output terminals; and an impedance circuit provided in between sources of the pair of transistors, canceling a first cutoff characteristic on a high frequency side in frequency characteristics of the amplifier circuit including the pair of transistors, and forming a second cutoff characteristic on a higher frequency side than the first cutoff characteristic.

According to this amplifier, the first cutoff characteristic is cancelled, and the second cutoff characteristic is formed on the higher frequency side than the first cutoff characteristic, thereby enabling the characteristic to be improved up to the broader band by shifting the cutoff characteristic effectively to the high frequency side.

The object and advantage of the embodiment will be realized and attained by means of the elements and combinations particularly pointed out in the claims.

It is to be understood that both the foregoing general description and the following detailed description are exemplary and explanatory only and are not restrictive of the invention, as claimed.

DESCRIPTION OF EMBODIMENT(S)

According to the present embodiment, the linearity of the amplifier can be ensured in the broader band than by the prior arts.

An amplifier circuit as one aspect of the embodiment will hereinafter be described with reference to the drawings. A configuration in the following embodiment is an exemplification, and the amplifier is not limited to the configuration in the embodiment.

Figure 1:
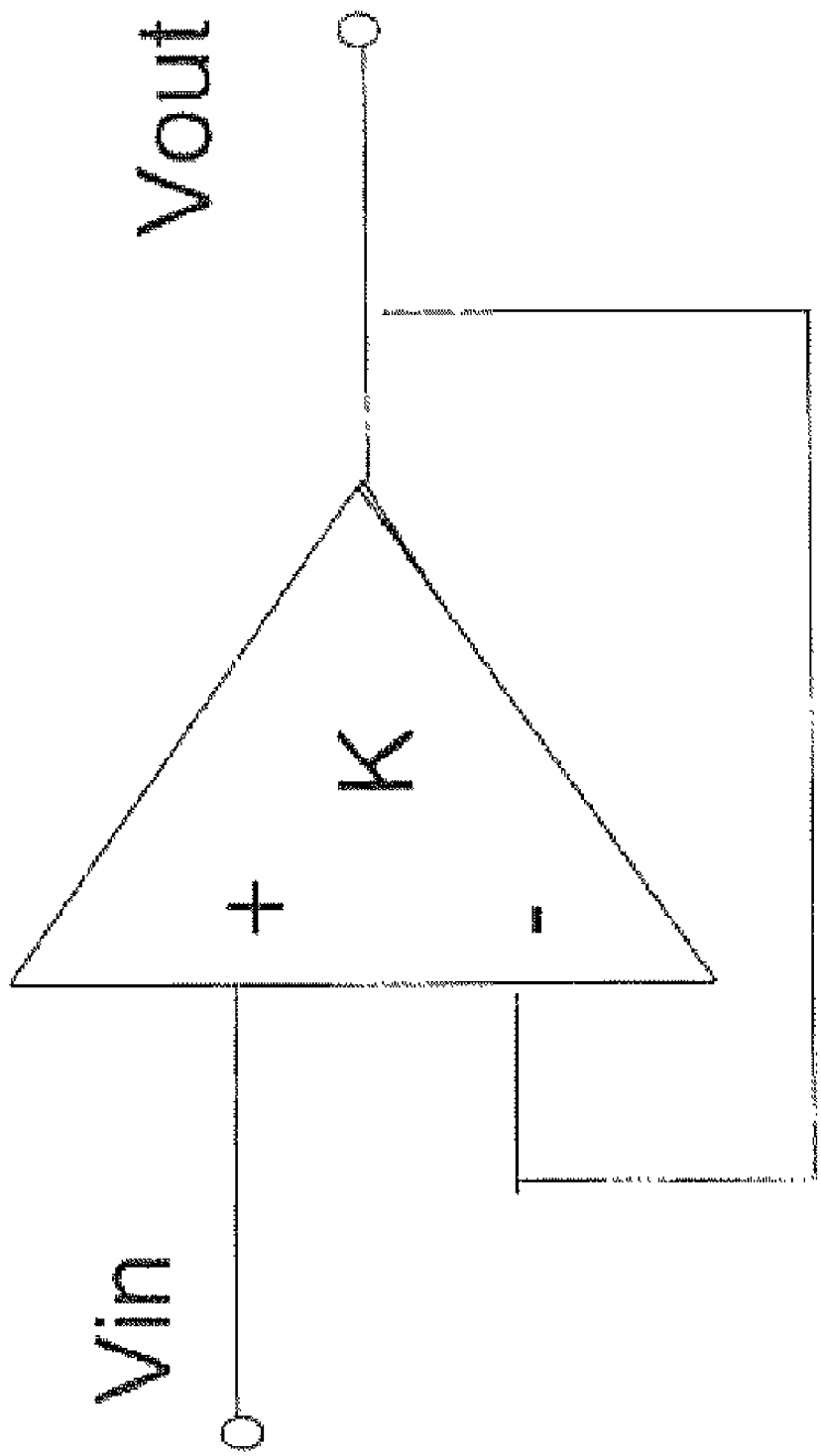
FIG. 1 is a diagram illustrating an example of a voltage follower using an operational amplifier.
Figure 2:
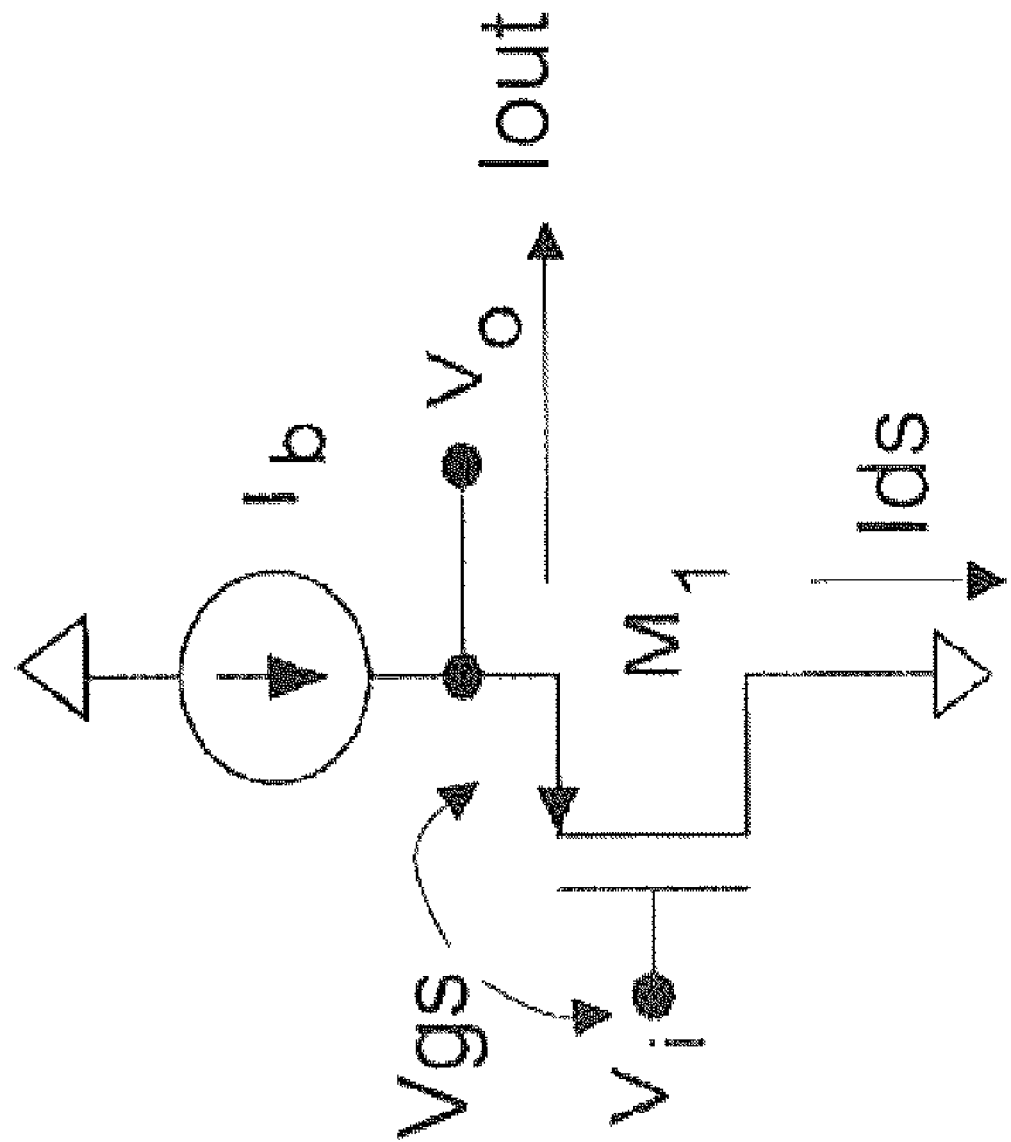
FIG. 2 is a diagram illustrating an example of a source follower.
Figure 3:
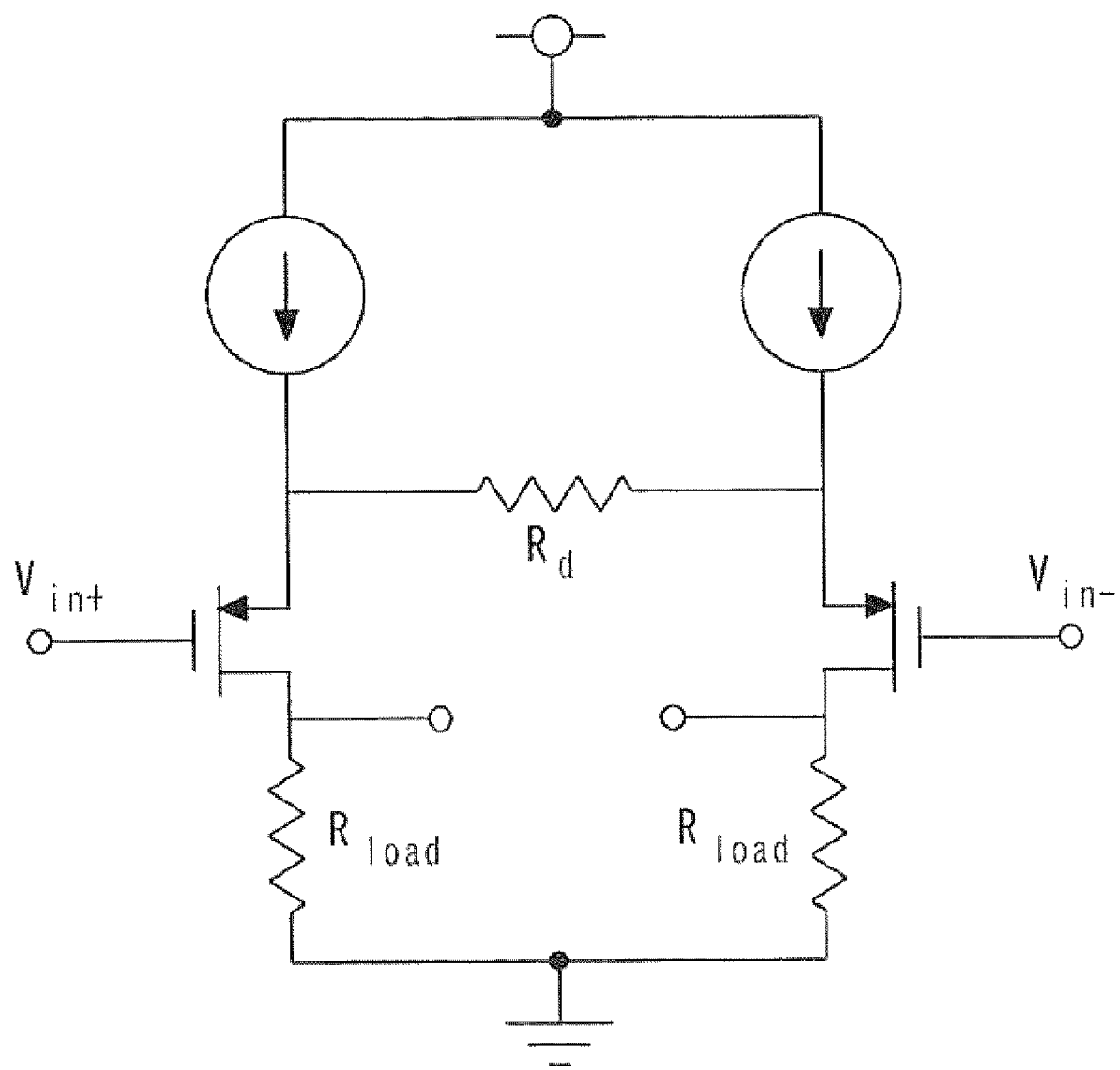
FIG. 3 is a diagram illustrating an example of a linear amplifier buffer.
Figure 4:
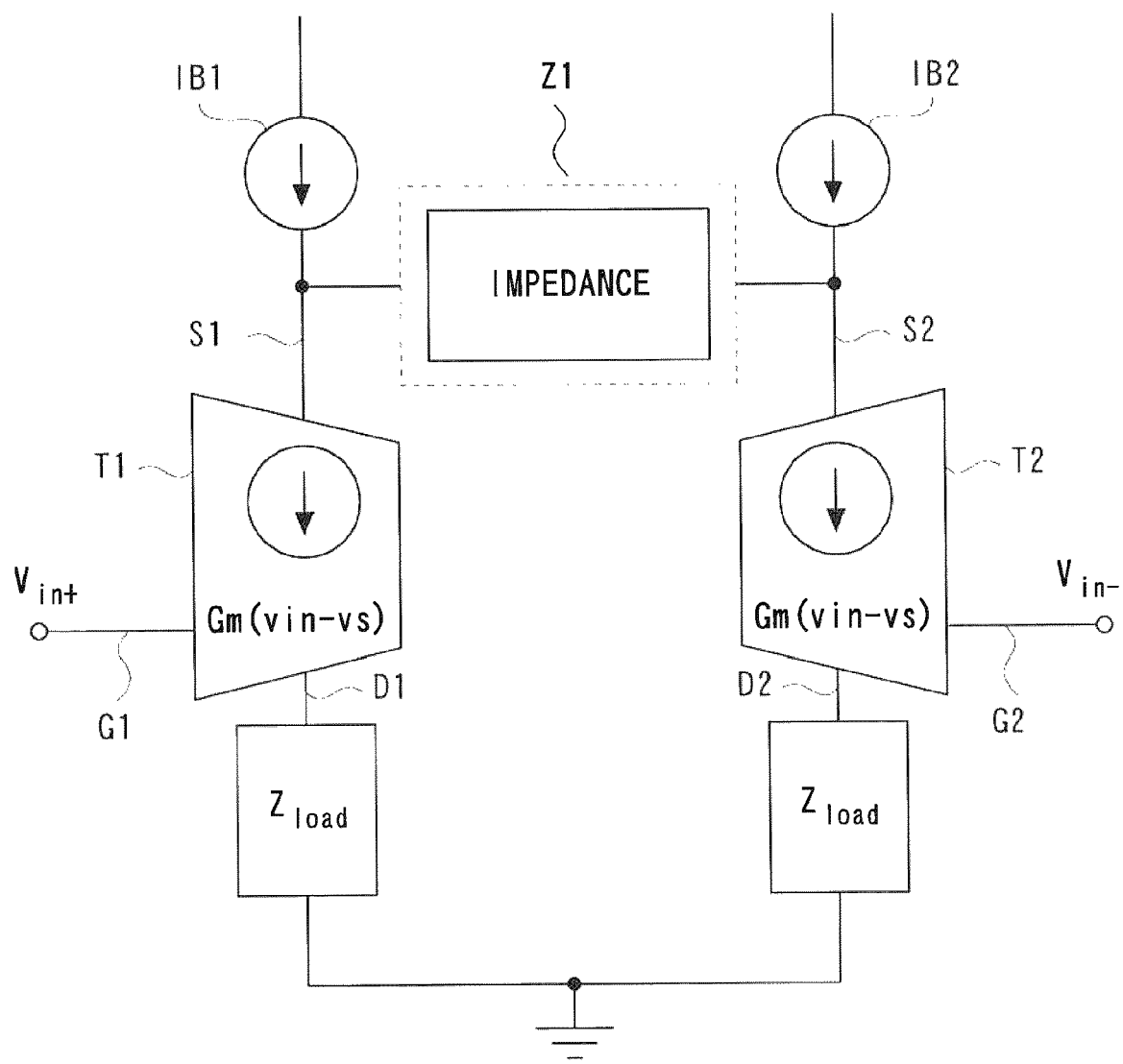
FIG. 4 is a diagram illustrating an outline of a configuration of an amplifier circuit.

FIG. 4 illustrates an outline of a configuration of an amplifier circuit. The amplifier circuit takes a configuration of inserting an impedance Z1 in between a source S1 of a transistor T1 and a source S2 of a transistor T2, as a substitute for a resistance Rd in a configuration of a linear amplifier illustrated in FIG. 3. Note that bias currents are supplied to the sources S1 and S2 respectively from bias current sources IB1, IB2.

Further, loads Zload are connected to a drain D1 of the transistor T1 and to a drain D2 of the transistor T2 between the earth and these transistors. Still further, an input voltage Vin+ is inputted to a gate G1 of the transistor T1. Yet further, an input voltage Vin− is inputted to a gate G2 of the transistor T2. Note that let Gm be transconductance defined as a ratio of a source/drain current to the input voltages Vin+, Vin− in this circuit. A relation between the input voltage Vi and the output voltage Vo can be expressed in the mathematical expression 7.

$$Vo = G \times Vin \times (1+s/\omega zc)/\{(1+s/\omega pc)(1+s/\omega pl)\}$$ (Mathematical Expression 7)

where,

G=Rload/Rd $\omega pl = 1/Rload \times Cload$

Impedance $Z = Rd \times (1+s/\omega zc)/(1+s/\omega pc)$

Accordingly, if a zero-point frequency ωzc of the impedance Z can be set in the vicinity of a pole frequency ωpl formed by a load capacity, a parasitic capacity and a load resistance, a value drawn by (1+s/ωzc)/(1+s/ωpl) becomes approximately "1" in a high-frequency domain in which a variable s is well apart from the zero-point frequency ωzc and the pole frequency ωpl, and a new pole ωpc can be also formed. Accordingly, if the impedance Z1 is designed so that the new pole ωpc is positioned on the higher-frequency side than the pole frequency ωpl, it follows that a high-frequency characteristic of a transfer function defined in the mathematical expression 7 is improved up to the new pole ωpc as compared with the original pole ωpl.

It should be noted that an allowable tolerance ϵ(|ωpl−ωpc|=<ϵ) between the original pole ωpl and the zero-point frequency ωzc is determined empirically or in simulation from a ripple having the frequency response characteristic of the circuit in FIG. 4. It is known that a magnitude of the ripple of the frequency response (step response) of the circuit depends on the frequency difference |ωpl−ωpc|. Namely, the pole (1+s/ωpl) of the transfer function shown in the mathematical expression 7 forms a gain characteristic which decreases by 20 db/dec (a ratio at which a 20 db change is made when the frequency increases tenfold) in the high-frequency domain. On the other hand, the zero-point (1+s/ωzc) forms a gain characteristic which increases by 20 db/dec. If this pole becomes coincident with a position of the zero point, the denominator and the numerator are cancelled (factors common to both of the denominator and the numerator are eliminated). If there is a difference between the original pole ωpl and the zero-point frequency ωzc, however, this difference causes occurrence of the ripple of the frequency response (step response). The ripple has a tendency that its magnitude rises according as the difference between the original pole ωpl and the zero-point frequency ωzc increases. Such being the case, for example, in the mathematical expression 7, after a step function has been given as Vin and converted into a function in a time domain, the difference between the original pole ωpl and the zero-point frequency ωzc may be set so that the ripple takes a desired design target value. Further, for instance, a circuit simulator may set the circuit elements (the resistance, the capacitor, etc) so that the ripple takes the desired design target value by obtaining the frequency response.

WORKING EXAMPLE 1

Figure 5:
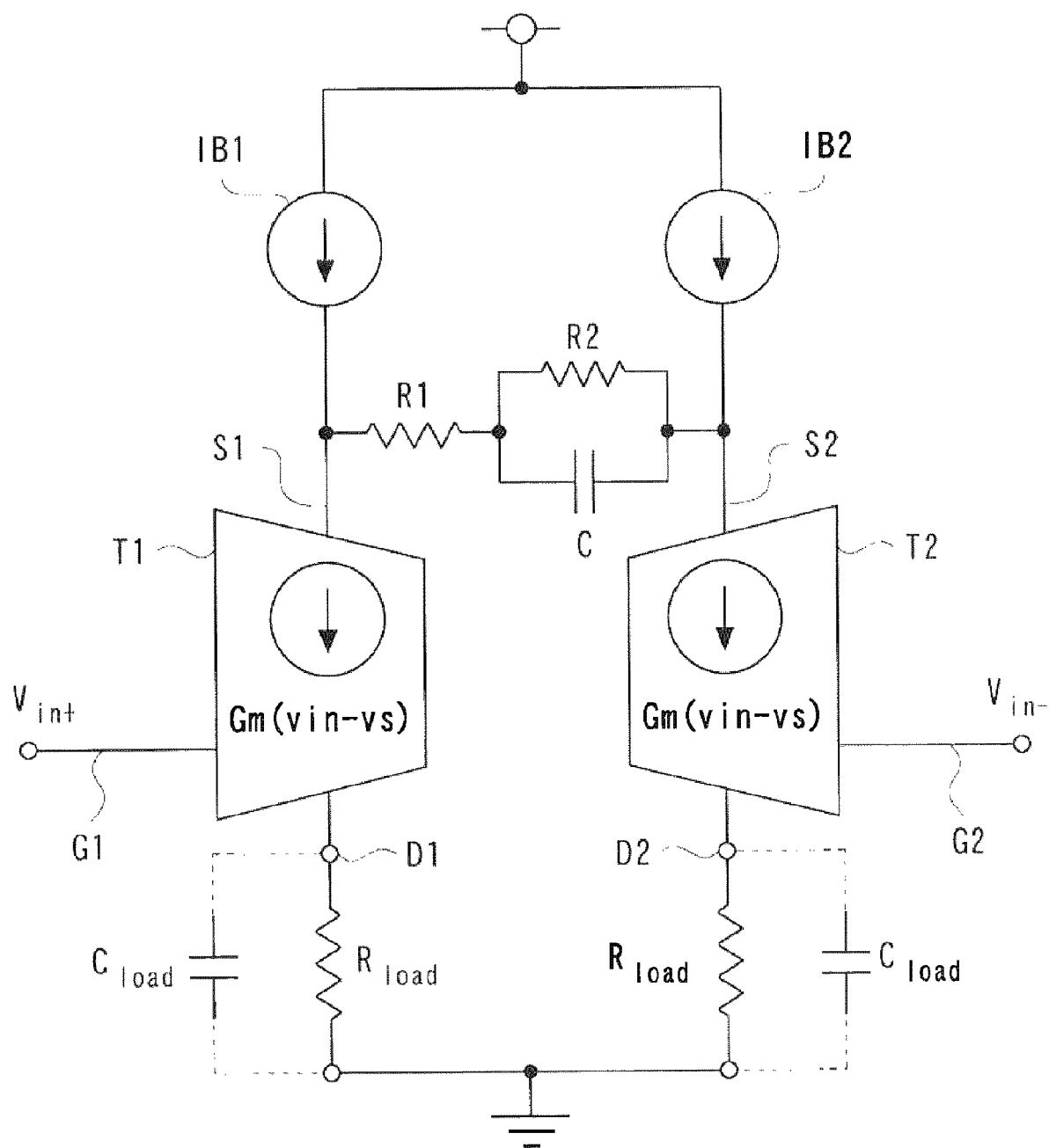
FIG. 5 is a diagram of a circuit according to a first working example.

FIG. 5 illustrates a circuit according to a first working example. This circuit takes a configuration that the impedance Z1 connects a resistance R1 in series to a parallel circuit of a resistance R2 and a capacitor C in the circuit shown in FIG. 4. Further, a configuration, it is assumed, is that the load impedances Zload connected respectively to the drains D1, D2 of the transistors T1, T2 connect resistances Rload and parasitic capacitors Cload in parallel.

Then, a relation between the input voltage Vi and the output voltage Vo can be expressed in the mathematical expression 8.

$$Vo = \frac{R_{load}}{R_1 + R_2} \times \frac{1 + sR_2C}{1 + s\frac{R_1R_2}{R_1+R_2}C} \times$$

$$\frac{1}{1 + sR_{load}C_{load}} Vin \qquad \text{[Mathematical Expression 8]}$$

$$\Delta\omega = \omega_{Zinsert} - \omega_{Pload} =$$

$$\alpha_1 R_2 \alpha_2 C - \beta_1 R_{load} \beta_2 C_{load}$$

$$sup R_2 C = R_{load} C_{load}$$

$$\Delta\omega = (\alpha_1\alpha_2 - \beta_1\beta_2)R_2C$$

In this case, $\omega zc$ and $\omega pc$ can be expressed in the mathematical expression 9.

$$1/\omega zc = C \cdot R2$$

$$1/\omega pc = R1 \cdot R2 \cdot C/(R1+R2) \qquad \text{(Mathematical Expression 9)}$$

where $\alpha1$, $\alpha2$, $\beta1$ and $\beta2$ are coefficients of variations of the resistance R2, the capacitor C, the load resistance Rload and the parasitic capacitor Cload, which accompany variations of the process conditions for manufacturing the semiconductor device.

For example, assuming that the coefficient of variation of the resistance is approximately the same as the coefficient of variation of the capacitor, such an estimation can be made that $\alpha1=\beta1$ and $\alpha2=\beta2$, and hence the following mathematical expression can be given.

$$\Delta\omega=1/\{\alpha1\alpha2(R2 \cdot C - Rload \cdot Cload)\}; \qquad \text{(Mathematical Expression 10)}$$

Moreover, if there is no variation of the process, the following mathematical expression can be given.

$$\Delta\omega=1/\{R2 \cdot C - Rload \cdot Cload\}; \qquad \text{(Mathematical Expression 11)}$$

Further, even when the variations of the process are not uniform with respect to the resistance and the capacitor and if the design value is set such as R2·C=Rload·Cload, the following mathematical expression can be given.

$$\Delta\omega=1/\{(\alpha1\alpha2-\beta1\beta2)(R2 \cdot C)\}; \qquad \text{(Mathematical Expression 12)}$$

Figure 6:
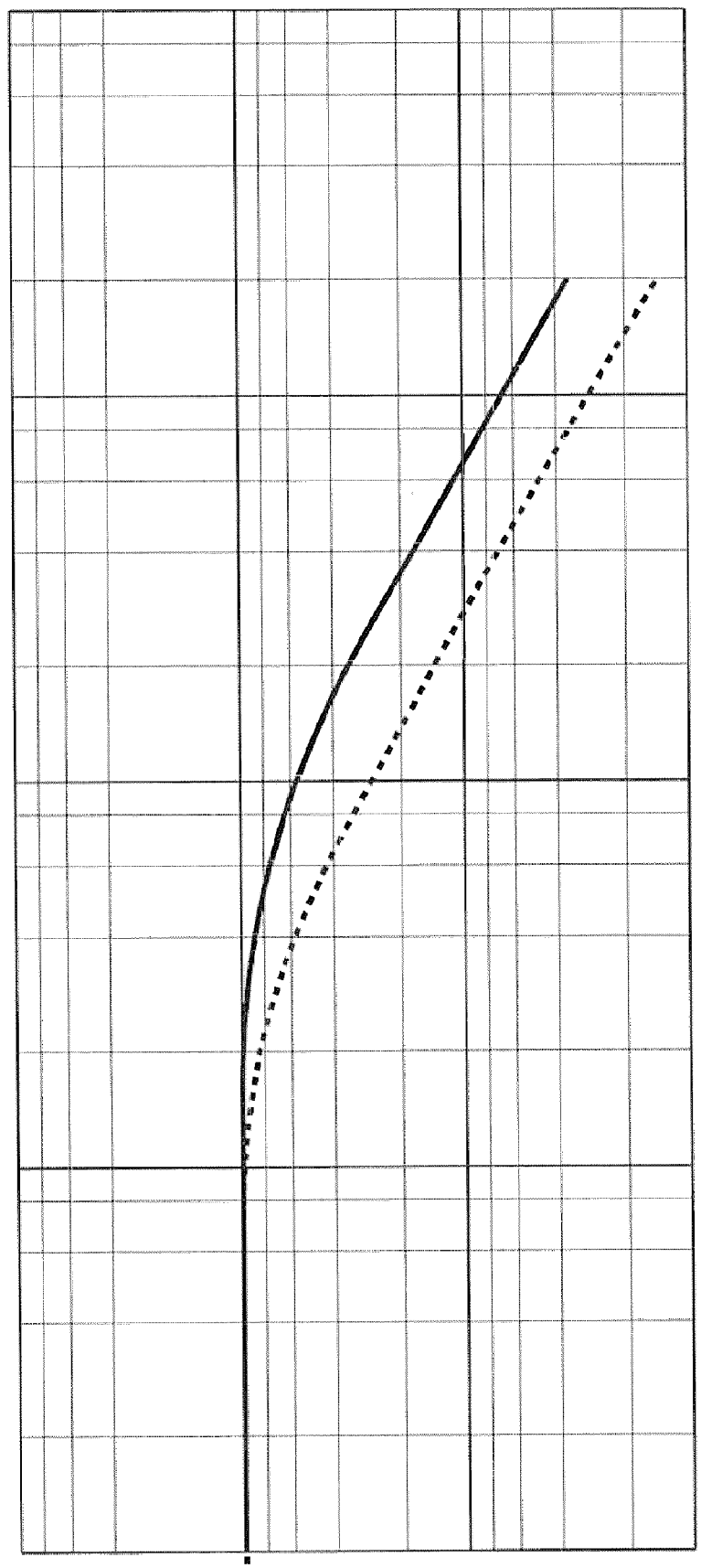
FIG. 6 is a diagram illustrating an example of a result of calculating a numeric value of transfer function of Vo/Vin.

FIG. 6 illustrates an example of a result of calculating a numeric value of the transfer function of Vo/Vin.

At this time, a treble cutoff frequency before inserting the impedance between the sources S1 and S2 is improved up to approximately a 2.5-fold frequency from $\omega pl$ to $\omega pc$.

Figure 7A:
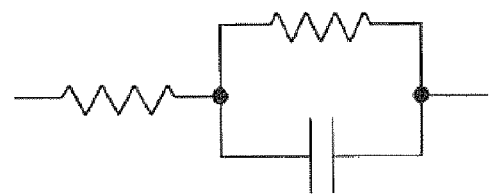
FIG. 7A is a diagram illustrating a first example of a configuration of an impedance formed between sources.
Figure 7B:
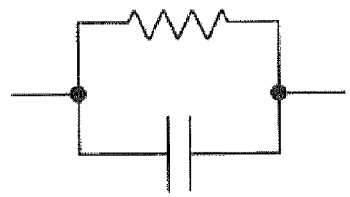
FIG. 7B is a diagram illustrating a second example of the configuration of the impedance formed between sources.
Figure 7C:
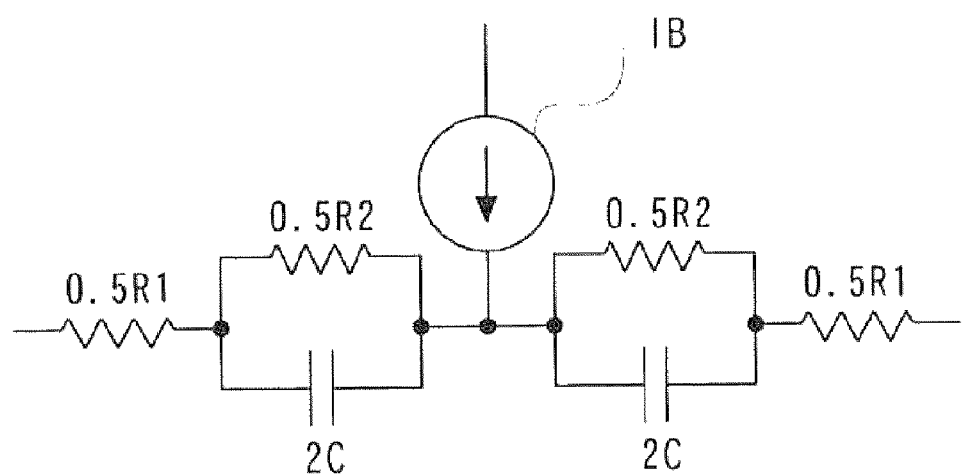
FIG. 7C is a diagram illustrating a third example of the configuration of the impedance formed between sources.

FIGS. 7A-7C are diagrams each illustrating an example of the impedance formed between the sources S1 and S2. FIG. 7A illustrates the same configuration as in FIG. 5. FIG. 7B illustrates a configuration of the impedance in FIG. 5, from which R1 is removed. In this case, idealistically R1 is a resistance 0, however, since there actually exists a slight resistance of a conductive path of the element, R1 can be considered to be by far smaller than R2 if this slight resistance is assumed to be R1, and the mathematical expression 8 can be transformed into the mathematical expression 13.

$$V0=(Rload/R2)\times(1+s \cdot R2 \cdot C)/[(1+sR1 \cdot C)\times(1+s \cdot Rload \cdot Cload)] \qquad \text{(Mathematical Expression 13)}$$

Accordingly, in this case, the treble cutoff frequency after inserting the impedance is given by $\omega pc=1/(R1 \cdot C)$ Moreover, FIG. 7C illustrates a configuration in which a current source IB for supplying the bias current is com-monized. In this case, as compared with the resistances R1, R2 and the capacitor C in FIG. 5, let 0.5R1, 0.5R2 be the resistances and 2·C be the capacitor respectively, and the same transfer function as in the mathematical expression 8 is obtained under the assumption that the right and left operation amplifier circuits have perfectly symmetric element characteristics.

Figure 8:
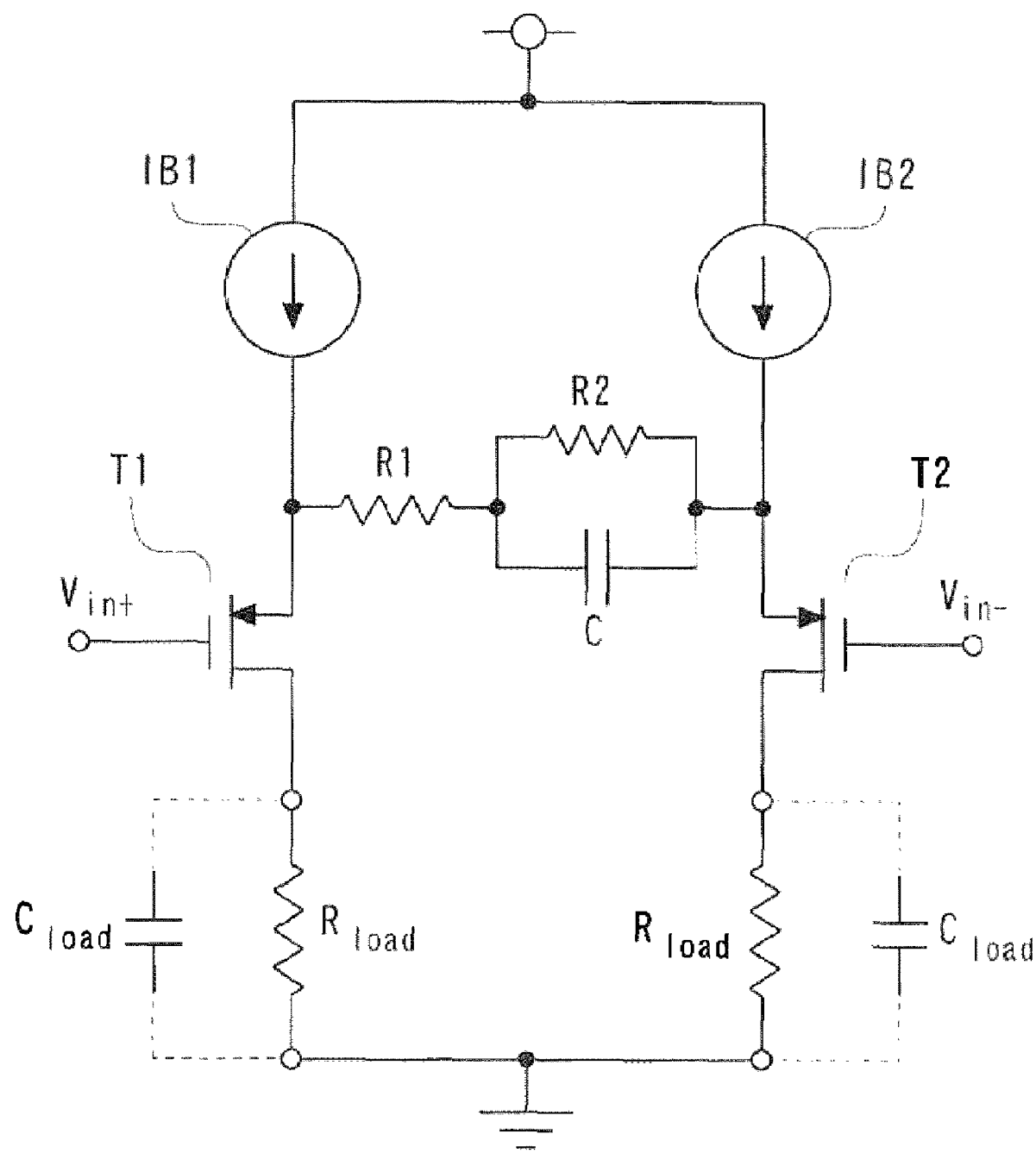
FIG. 8 is a diagram illustrating more specifically the circuit in the first working example.

FIG. 8 illustrates a further specific configuration of the circuit in the first working example, in which the transistors T1 and T2 are illustrated as PMOS transistors. In this circuit also, the same discussion as in FIG. 6 is established.

Figure 9:
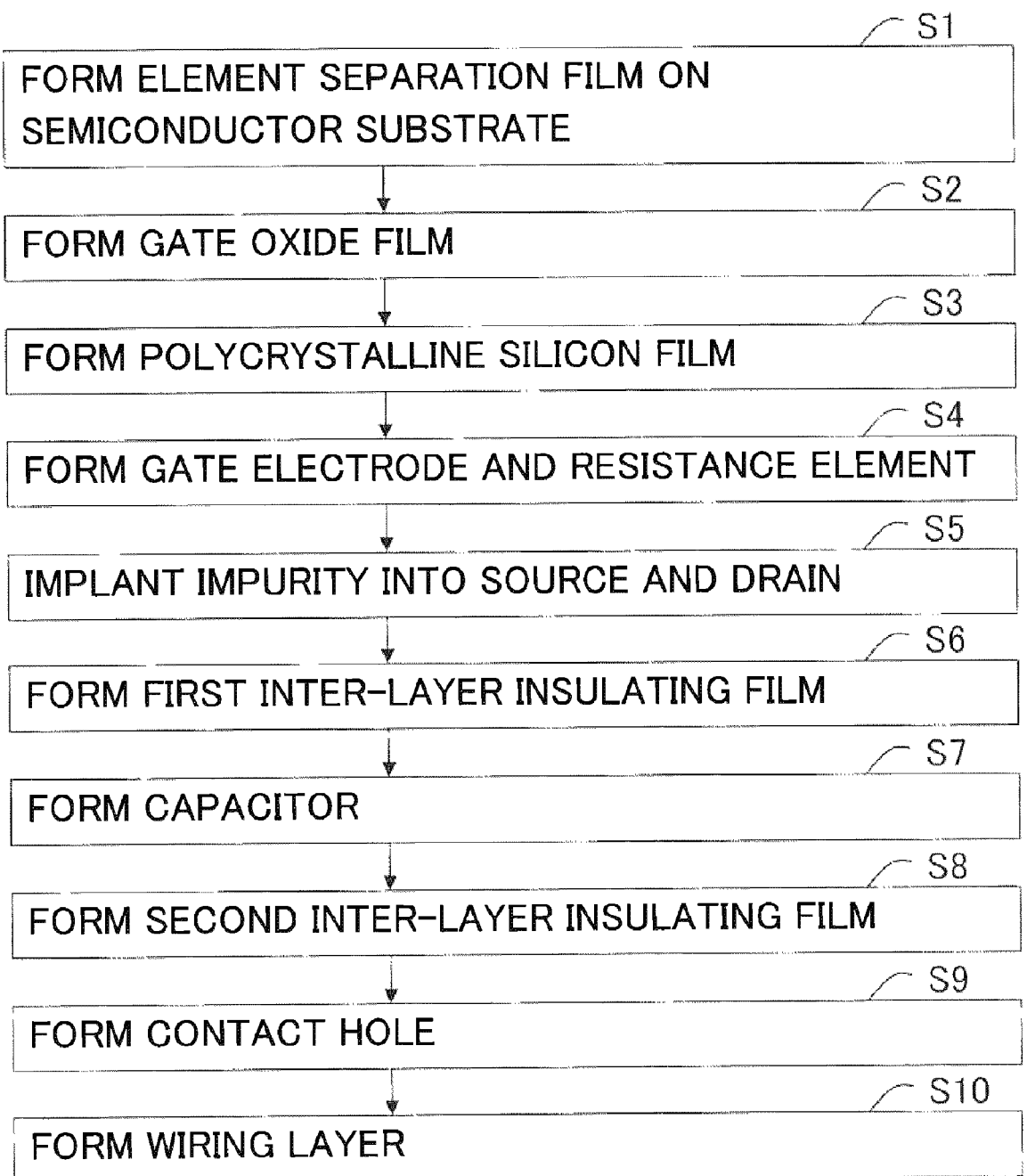
FIG. 9 is a flowchart illustrating a circuit manufacturing method.

FIG. 9 illustrates an outline of a manufacturing process of manufacturing the circuit in FIG. 8. The manufacturing process is the same as a manufacturing process of a normal MOS transistor including the resistance or an capacitor. To be specific, at first, an element separation film is formed (S1). The element separation film can be formed by, e.g., LOCOS (Local Oxidation of Si) method.

Next, a gate oxide film is formed based on thermal oxidation by an oxidation furnace in a region formed with the transistor (S2). Further, a polycrystalline silicon film is grown over the entire semiconductor substrate by a chemical vapor deposition method (S3). Then, a gate electrode is formed on the gate oxide film by photolithography and etching. At this time, a resistance element pattern is formed on the element separation film with a resist pattern used for forming the gate oxide film and the gate electrode, whereby a polycrystalline silicon resistance element can be formed together with the gate electrode (S4). The resistance element is employed as the load resistance Rload or each of the resistances R1, R2 which build up the impedance between the sources.

Next, a source and a drain are formed by implanting an impurity ion with the gate electrode serving as a mask (S5). The transistor is thereby constructed. Note that a high-concentration impurity is further implanted into regions, with which a contact hole is brought into contact, of the source and the drain.

Moreover, a first inter-layer insulating film is formed (S6). Next, a capacitor is formed on the inter-layer insulating film (S7). The capacitor can be formed in a stack structure including, e.g., a lower electrode, a dielectric and an upper electrode. The upper electrode of the capacitor is formed in a pattern smaller than the lower electrode and is set as a region where the contact hole leading to the lower electrode is formed. The capacitor is used as a capacitor 2 that forms the load capacitor Cload or the impedance between the sources.

Next, a second inter-layer insulating film is formed (S8). Then, the contact hole is formed in the inter-layer insulating film, and the source/drain of the transistor, two points on the resistance element, and the lower electrode and the upper electrode of the capacitor are exposed (S9). In this case, the exposure of the source/drain of the transistor and two points on the resistance element entails etching the two-layered inter-layer insulating films. On the other hand, the exposure of the lower electrode of the capacitor entails etching the second inter-layer insulating film and the insulating film corresponding to the dielectric layer. Further, it may be sufficient for exposing the upper electrode of the capacitor to etch the second inter-layer insulating film. The contact hole is formed in the inter-layer insulating films each having a different film thickness, and hence, for example, it may be enough to form a stopper film on the upper electrode. Then, the contact hole is embedded with a plug composed of tungsten etc, thereby connecting the source/drain of the transistor, the two points on the resistance element and the lower electrode and the upper electrode of the capacitor to the uppermost layer. It should be noted that a resistance value of the resistance element can be adjusted with, e.g., a distance between the contact holes connecting with the resistance element. Further, the resistance value may also be adjusted with a concentration of the impurity implanted into the polycrystalline silicon which composes the resistance element.

Next, a wiring layer for connecting the contact hole (plug) is formed (S10). Through the process described above, the circuit described in the first embodiment (first working example) can be built up.

As discussed above, according to the embodiment, the impedance including the resistances R1, R2 and the capacitor C is provided between the sources of the two transistors included in the differential amplifier, whereby it is feasible to form the zero point (an angular frequency ωzc) which cancels the pole forming the treble cutoff frequency ωpl with respect to the transfer function representing the relation between the input signal and the output signal and to form the new treble cutoff frequency ωpc.

In this case, the angular frequency ωzc forming the zero point is expressed in the mathematical expression 9, and therefore the circuit can be built up so that the zero point (the angular frequency ωzc) which cancels the pole forming the treble cutoff frequency ωpl becomes an equal values to or a value having a difference smaller than a predetermined allowable value ε from a frequency wpl of the pole in a way that adjusts the resistance R2 and the capacity of the capacitor C. As a result, for instance, the ripple caused when in the step response can be restrained.

Moreover, the new treble cutoff frequency ωpc is expressed in the mathematical expression 9, and consequently the treble cutoff frequency can be shifted to a higher value by controlling the resistances R1, R2 and the capacity C.

Note that in FIG. 9 illustrates the circuit manufacturing method of forming the element separation film by the LOCOS method, the resistance on the element separation film and further the capacitor on the upper layer thereof. The formation of the circuit is not, however, limited to this manufacturing method. For example, the element separation film may also be formed by STI (Shallow Trench Isolation). In this case, the capacitor may also be formed in a structure of inserting a trench structure included in the STI.

SECOND WORKING EXAMPLE

A second working example will be explained with reference to FIG. 10. The second working example will specifically exemplify a construction of the transistor which forms the transconductance in the first working example. Other configurations and operations are the same as those in the first working example. Such being the case, the same components as those in the first working example are marked with the same symbols and numerals, and their explanations are omitted.

In this circuit, transistors T10, T11, T12 are combined to build up an amplifier element. To be specific, gates of the transistors T11, T12 are connected to a drain D1 of the transistor T10. Accordingly, a transconductance gm1 defined as a ratio of a drain current (source drain current) ID12 of the transistor T12 to an input signal Vin+ to the gate of the transistor T10 can be acquired as a product "gm10·gm12" of a transconductance gm10 of the transistor T10 and a transconductance gm12 of the transistor T12.

Similarly, in an amplifier element including transistors T20, T21, T22, a transconductance gm2 defined as a ratio of a drain current (source drain current) ID22 of the transistor T22 to an input signal Vin– to the gate of the transistor T20 can be acquired as a product "gm20·gm22" of a transconductance gm20 of the transistor T20 and a transconductance gm22 of the transistor T22.

Figure 10:
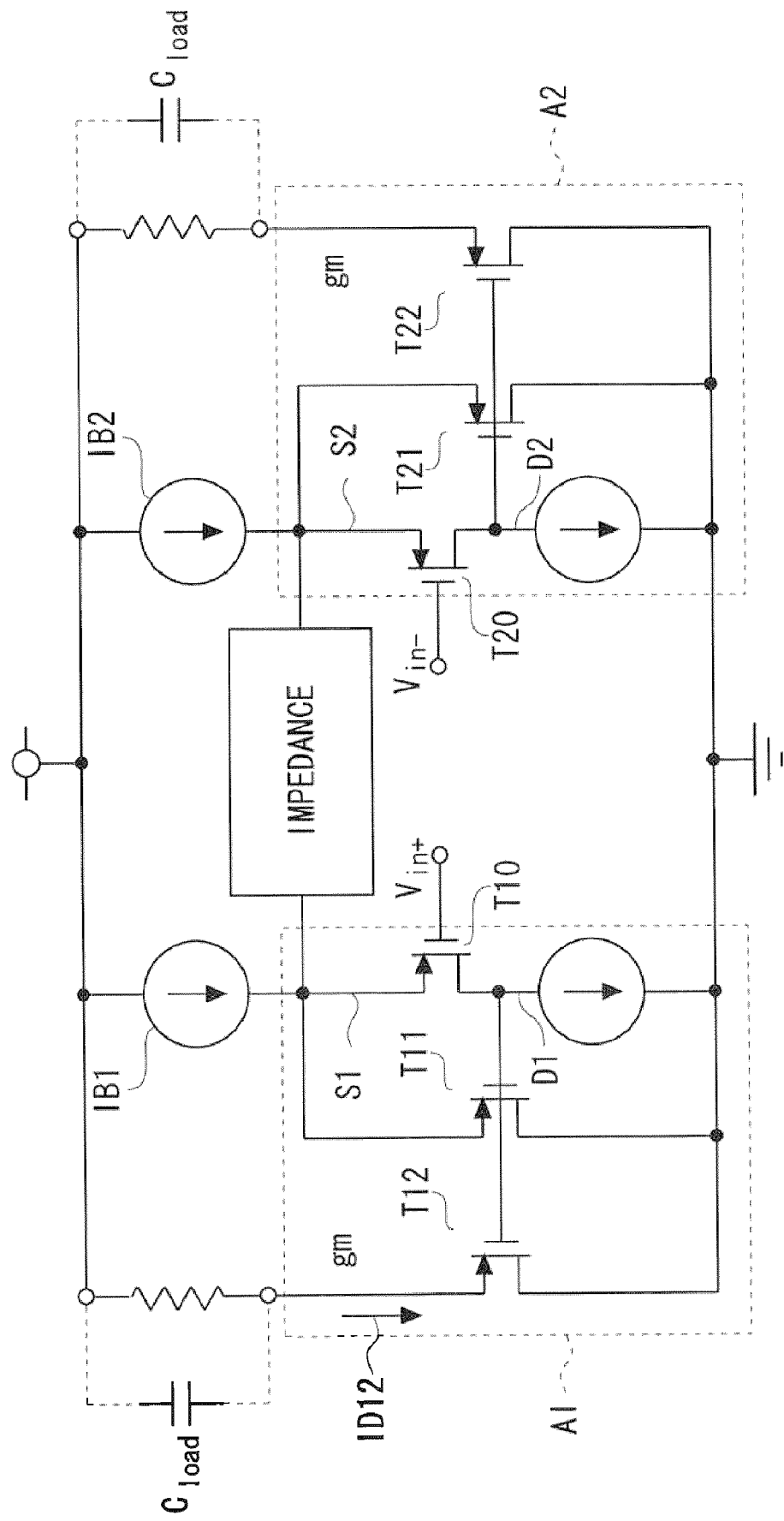
FIG. 10 is a diagram illustrating more specifically the transistor which forms a transconductance gm in the circuit in the second working example.

In the case of constructing the amplifier element with the plurality of these transistors, portions circumscribed by dotted line areas A1 and A2 in FIG. 10 can be deemed to be the transistors T1 and T2 in FIG. 5. Therefore, in the same way as in the first working example, the impedance is inserted in between the sources of the transistors T10 and T20, then the transfer function as demonstrated in the mathematical expression 6 is formed, and the treble cutoff frequency wpl is cancelled similarly to the first working example, thereby enabling the new treble cutoff frequency wpc to be set on the higher frequency side.

All example and conditional language recited herein are intended for pedagogical purposes to aid the reader in understanding the invention and the concepts contributed by the inventor to furthering the art, and are to be construed as being without limitation to such specifically recited examples and conditions, nor does the organization of such example in the specification relate to a showing of the superiority and inferiority of the invention. Although the embodiment(s) of the present invention(s) has (have) been described in detail, it should be understood that the various changes, substitutions, and alterations could be made hereto without departing from the spirit and scope of the invention.

What is claimed is:

1. An amplifier comprising:
   a pair of transistors amplifying differential signals of input signals to respective input terminals and outputting differential output signals to respective output terminals; and
   an impedance circuit provided in between sources of said pair of transistors, canceling a first cutoff characteristic on a high frequency side in frequency characteristics of an amplifier circuit including said pair of transistors, and forming a second cutoff characteristic on a higher frequency side than the first cutoff characteristic.

2. An amplifier according to claim 1, wherein the first cutoff characteristic is formed by a load capacity included in a load of said amplifier, a parasitic capacity parasitic to a circuit connected to the load and a load resistance included in the load, and corresponds to a pole included in a transfer function of said amplifier, and
   said impedance circuit forms a zero point in a predetermined frequency range from the pole in the transfer function.

3. An amplifier according to claim 1, wherein said impedance circuit includes a capacity element, and said capacity element is formed by a manufacturing process which forms the load capacity.

4. An amplifier according to claim 1, wherein said impedance circuit includes a resistance element, and said resistance element is formed by a manufacturing process which forms the load resistance.

* * * * *